(12) United States Patent
Nishino et al.

(10) Patent No.: US 10,051,730 B2
(45) Date of Patent: Aug. 14, 2018

(54) MULTILAYER SUBSTRATE MANUFACTURING METHOD AND MULTILAYER SUBSTRATE

(71) Applicant: Murata Manufacturing Co., Ltd., Nagaokakyo-shi, Kyoto-fu (JP)

(72) Inventors: Kosuke Nishino, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 171 days.

(21) Appl. No.: 15/046,696

(22) Filed: Feb. 18, 2016

(65) Prior Publication Data

US 2016/0165720 A1    Jun. 9, 2016

Related U.S. Application Data

(63) Continuation of application No. PCT/JP2015/054939, filed on Feb. 23, 2015.

(30) Foreign Application Priority Data

Feb. 26, 2014 (JP) ................................. 2014-035526

(51) Int. Cl.
*H05K 7/00* (2006.01)
*H05K 1/02* (2006.01)
(Continued)

(52) U.S. Cl.
CPC ......... *H05K 1/0298* (2013.01); *H05K 1/0296* (2013.01); *H05K 1/0313* (2013.01);
(Continued)

(58) Field of Classification Search
CPC ......... H05K 1/186; H05K 1/188; H05K 1/111
(Continued)

(56) References Cited

U.S. PATENT DOCUMENTS 6,392,898 B1 * 5/2002 Asai .................. H01L 23/49816
361/794
2010/0140800 A1 * 6/2010 Hagihara .............. H01L 21/563
257/737

(Continued)

FOREIGN PATENT DOCUMENTS

JP    03-187293 A    8/1991
JP    2008-172030 A    7/2008
(Continued)

OTHER PUBLICATIONS

Official Communication issued in International Patent Application No. PCT/JP2015/054939, dated May 26, 2015.

*Primary Examiner* — Tuan T Dinh
(74) *Attorney, Agent, or Firm* — Keating & Bennett, LLP

(57) ABSTRACT

In a method for manufacturing a multilayer substrate, conductive patterns to define mounting electrodes are formed on a principal surface of a first base layer, and conductive patterns are formed on principal surfaces of other base layers. The base layers are stacked such that the principal surface of the first base layer is the outermost surface. The stacked base layers are laminated by pressing an elastic body to the side of the first base layer to form a multilayer body. In the multilayer body, the conductive patterns are arranged such that the proportion of the conductive patterns in regions overlapping the conductive patterns on the first base layer as viewed in the stacking direction is lower than that in a region surrounding the regions overlapping the conductive patterns.

15 Claims, 15 Drawing Sheets

(51) Int. Cl.
*H05K 3/46* (2006.01)
*H05K 1/03* (2006.01)
*H05K 1/14* (2006.01)
*H05K 3/00* (2006.01)

(52) U.S. Cl.
CPC .......... *H05K 1/144* (2013.01); *H05K 3/0058* (2013.01); *H05K 3/4632* (2013.01); *H05K 2201/09472* (2013.01)

(58) Field of Classification Search
USPC .......................... 361/760–790; 174/250–264
See application file for complete search history.

(56) References Cited

U.S. PATENT DOCUMENTS

| | | | |
|---|---|---|---|
| 2011/0284269 | A1* | 11/2011 | Maeda .................. H05K 1/113 |
| | | | 174/251 |
| 2012/0012369 | A1 | 1/2012 | Kato |
| 2013/0213699 | A1* | 8/2013 | Chisaka ................ H05K 1/186 |
| | | | 174/255 |
| 2013/0299219 | A1* | 11/2013 | Chisaka .............. H05K 1/0271 |
| | | | 174/257 |
| 2013/0330509 | A1 | 12/2013 | Otsubo |

FOREIGN PATENT DOCUMENTS

| | | |
|---|---|---|
| JP | 2012-114153 A | 6/2012 |
| JP | 2012-129364 A | 7/2012 |
| WO | 2010/113539 A1 | 10/2010 |
| WO | 2012/121141 A | 9/2012 |

\* cited by examiner

MULTILAYER SUBSTRATE MANUFACTURING METHOD AND MULTILAYER SUBSTRATE

BACKGROUND OF THE INVENTION

1. Field of the Invention

The present invention relates to a method for manufacturing a multilayer substrate in which a plurality of thermoplastic resin base layers including conductive patterns located thereon are stacked and to the multilayer substrate.

2. Description of the Related Art

International Publication No. 2010-113539 discloses a circuit board including a multilayer body in which insulator layers made of a flexible material are stacked. The circuit board includes an outer electrode that is used for mounting an electronic component and that is disposed on a flat top surface of the multilayer body and another outer electrode that is to be connected to a collective board and that is disposed on a flat bottom surface of the multilayer body.

However, in the circuit board described in International Publication No. 2010-113539, it is difficult to arrange the electronic component in a correct location for the outer electrode on the top surface of the circuit board and also difficult to arrange the outer electrode on the bottom surface of the circuit board in a correct location for the collective board. Thus, the mounting location of the electronic component may deviate from the correct location for the circuit board or the mounting location of the circuit board may deviate from the correct location for the collective board.

SUMMARY OF THE INVENTION

Accordingly, preferred embodiments of the present invention provide a multilayer substrate manufacturing method and multilayer substrate that are capable of reducing deviation of a mounting location.

A multilayer substrate manufacturing method according to an aspect of various preferred embodiments of the present invention includes a mounting-electrode forming step, a stacking step, and a thermocompression bonding step. The mounting-electrode forming step forms a mounting electrode on a principal surface of a thermoplastic resin base included in a plurality of thermoplastic resin base layers including thermoplastic resin base layers. The stacking step stacks the plurality of thermoplastic resin base layers such that the principal surface of the thermoplastic resin base with the mounting electrode formed thereon is an outermost surface. The thermocompression bonding step laminates the plurality of stacked thermoplastic resin base layers by thermocompression bonding by pressing an elastic member to a portion where the mounting electrode is formed on the outermost surface. In the stacking step, the plurality of thermoplastic resin base layers are stacked such that a proportion of low-flow members in a stacking direction in a region overlapping the mounting electrode as viewed in the stacking direction is lower than that in a region surrounding the region overlapping the mounting electrode. The low-flow members has flowability lower than that in the thermoplastic resin base layers at a temperature in thermocompression bonding of the thermoplastic resin base layers.

In this configuration, the portion with a low proportion of the low-flow members is recessed inwardly in the stacking direction in thermocompression bonding, and thus a recessed portion is disposed in the portion where the mounting electrode is formed in the surface of the multilayer substrate. The multilayer substrate including this recessed portion preferably is arranged relative to a mounting electrode in a circuit board, such as a collective board, such that the mounting electrode of the circuit board is fit in the recessed portion, and thus the multilayer substrate is able to be accurately positioned relative to the mounting electrode.

The solder remains within the formed recessed portion in mounting the multilayer substrate on the circuit board, and the amount of protrusion of the solder from the multilayer substrate is able to be reduced. This significantly reduces or prevents failures such as shorts with other circuits caused by protrusion of the solder. The expansion of the solder is significantly reduced or prevented, thus the advantages offered by self-alignment are enhanced, and the deviation of the mounting location is significantly reduced or prevented.

The low-flow members may preferably include conductive patterns.

In this configuration, there is no need to arrange an additional low-flow member in order to form the recessed portion, and thus the profile of the multilayer substrate is significantly reduced.

In the stacking step, the plurality of thermoplastic resin base layers may preferably be stacked such that a number of the conductive patterns stacked in the region overlapping the mounting electrode as viewed in the stacking direction is lower than that in the region surrounding the region overlapping the mounting electrode.

In this configuration, the proportion of the conductive patterns in the region overlapping the mounting region.

The conductive patterns on the thermoplastic resin base layers may preferably define a coil wound around a winding axis being the stacking direction. In the stacking step, the plurality of thermoplastic resin base layers may preferably be stacked such that the mounting electrode is arranged in a region inside the coil as viewed in the stacking direction.

In this configuration, the coil pattern is able to function as one of the low-flow members. This eliminates the necessity to include an additional low-flow member and reduce the number of the low-flow members.

In the mounting-electrode forming step, the mounting electrode may preferably be formed on each of principal surfaces of different thermoplastic resin base layers. In the stacking step, the thermoplastic resin base layers may preferably be stacked such that the principal surfaces of the different thermoplastic resin base layers are opposite outermost surfaces. In the thermocompression bonding step, the elastic member may preferably be pressed to each of the outermost surfaces, on which the mounting electrodes are formed.

In the configuration, the recessed portion is formed inwardly in the stacking direction from the principal surface of the multilayer substrate opposite the principal surface to be mounted on the circuit board. Another electronic component is able to be mounted on the multilayer substrate including the recessed portion. In mounting the electronic component, it can be arranged such that the mounting electrode in the electronic component is fit in the recessed portion, and thus the electronic component is able to be accurately positioned relative to the multilayer substrate.

The solder remains within the formed recessed portion in mounting the multilayer substrate on the circuit board, and the amount of protrusion of the solder from the multilayer substrate is significantly reduced. This significantly reducing or preventing failures such as shorts with other circuits caused by protrusion of the solder. The expansion of the solder is significantly reduced, thus the advantages offered by self-alignment are enhanced, and the deviation of the mounting location is significantly reduced or prevented.

Various preferred embodiments of the present invention enables accurate positioning in mounting a multilayer substrate. It significantly reduces or prevents failures such as shorts with other circuits caused by solder used in mounting the multilayer substrate. Furthermore, it enhances the advantages offered by self-alignment by reducing the expansion of the solder and thus significantly reduces or prevents the deviation of the mounting location.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
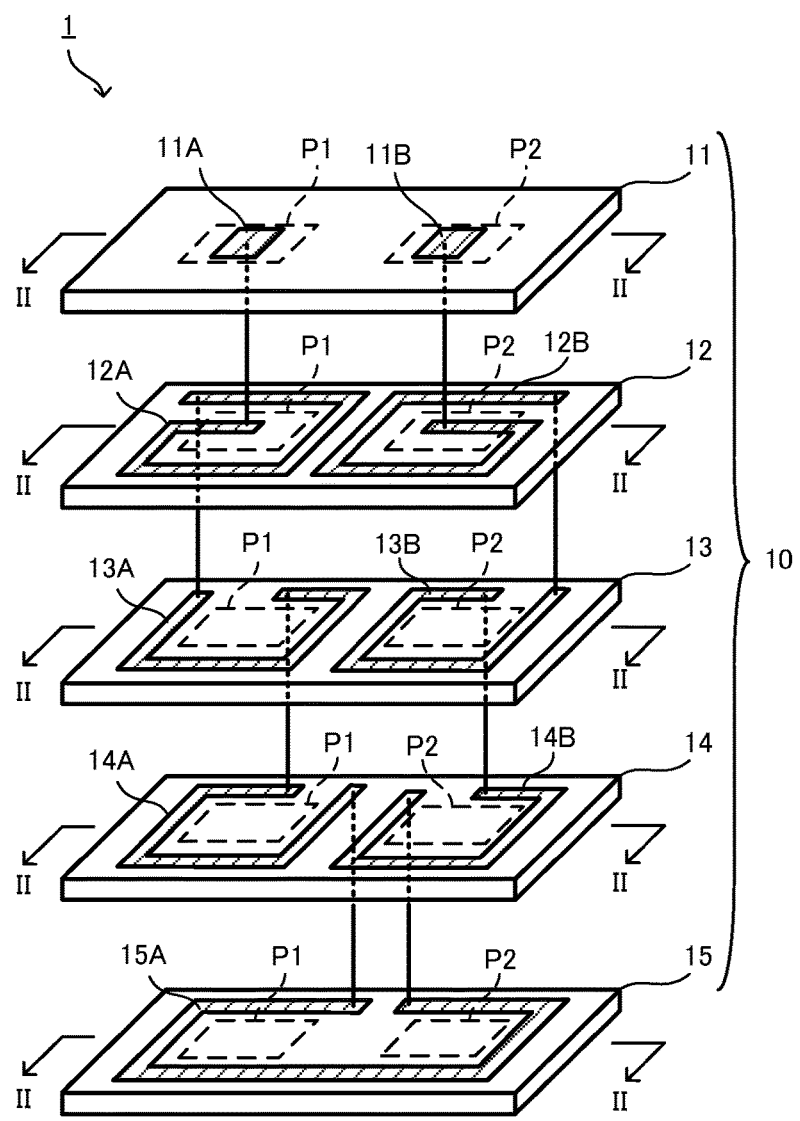
FIG. 1 is an exploded perspective view of a multilayer substrate according to a first preferred embodiment of the present invention.
Figure 2:
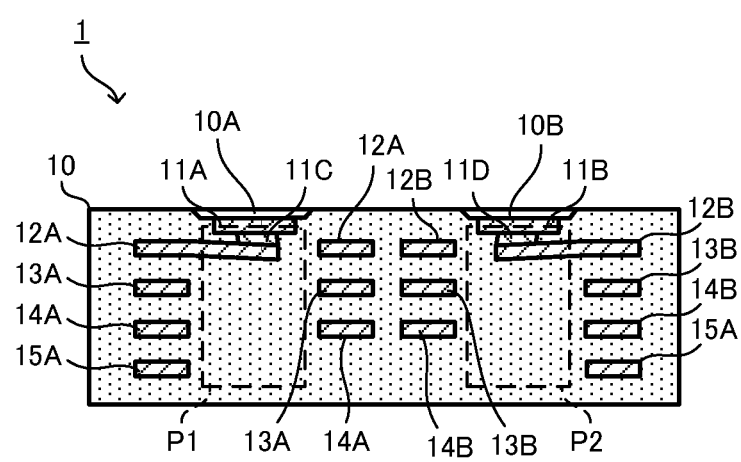
FIG. 2 is a cross-sectional view taken along the line II-II illustrated in FIG. 1.

FIG. 1 is an exploded perspective view of a multilayer substrate 1 according to a first preferred embodiment of the present invention. FIG. 2 is a cross-sectional view taken along the line II-II illustrated in FIG. 1. The multilayer substrate is formed preferably by laminating a plurality of thermoplastic resin layers stacked in a multilayer body 10 by thermocompression bonding. FIG. 1 is an exploded perspective view of the multilayer substrate 1 before thermocompression bonding. FIG. 2 is a cross-sectional view of the multilayer substrate 1 after thermocompression bonding.

The multilayer substrate 1 includes the multilayer body 10, which incorporates a coil. The multilayer body 10 is formed preferably by stacking a first base layer 11, second base layer 12, third base layer 13, fourth base layer 14, and fifth base layer 15 in sequence and laminating them by thermocompression bonding. Each of the base layers 11 to 15 preferably has a rectangular or substantially rectangular shape having long sides and short sides. The multilayer body 10 preferably has a rectangular or substantially rectangular parallelepiped shape. Each of the base layers 11 to 15 is formed such that an insulating thermoplastic resin, for example, liquid crystal polymer (LCP) resin, is used as a mother material.

Other examples of the thermoplastic resin may include polyetheretherketone (PEEK), polyetherimide (PEI), polyphenylene sulfide (PPS), and polyimide (PI). Any one of them may be used in place of the liquid crystal polymer resin.

Rectangular or substantially rectangular conductive patterns 11A and 11B are disposed on a first principal surface (top surface in FIG. 1) of the first base layer 11. The conductive patterns 11A and 11B are one example of "mounting electrode" and are also one example of "low-flow members". The first base layer 11 is the outermost layer in the multilayer body 10. The multilayer substrate 1 is mounted on a circuit board or other element such that its mounting surface is the principal surface of the first base layer 11 on which the conductive patterns 11A and 11B are disposed. The conductive patterns 11A and 11B preferably are used as the mounting electrodes in the multilayer substrate 1.

Interlayer connective conductors 11C and 11D are disposed on the first base layer 11 at locations that overlap the conductive patterns 11A and 11B as seen in plan view. The interlayer connective conductors 11C and 11D are one example of the "low-flow members" in the present invention.

In the present preferred embodiment, a region that surrounds the conductive pattern 11A and regions that overlap the region in the stacking direction of the multilayer body 10 are indicated by P1, and a region that surrounds the conductive pattern 11B and regions that overlap the region in the stacking direction of the multilayer body 10 are indicated by P2.

Conductive patterns 12A and 12B are disposed on a first principal surface (top surface in FIG. 1) of the second base layer 12 independently of each other. The second base layer 12 is stacked on the first base layer 11 such that the principal surface on which the conductive patterns 12A and 12B are disposed faces the first base layer 11. Each of the conductive patterns 12A and 12B preferably has a strip shape. The conductive pattern 12A has one end in the region P1, is extended from that location, and is wound so as to surround the region P1. The conductive pattern 12B has one end in the region P2, is extended from that location, and is wound so as to surround the region P2. The end of the conductive pattern 12A located in the region P1 is conductively connected to the conductive pattern 11A with the interlayer connective conductor 11C interposed therebetween disposed on the first base layer 11. The end of the conductive pattern 12B located in the region P2 is conductively connected to the conductive pattern 11B with the interlayer connective conductor 11D interposed therebetween disposed on the first base layer 11.

The conductive patterns 12A and 12B are one example of the "low-flow members". Each of the conductive patterns 12A and 12B has flowability lower than that in the base layers 11 to 15 in the multilayer body 10 at a temperature in thermocompression bonding (e.g., about 250° C. to about 350° C.)

Conductive patterns 13A and 13B are disposed on a first principal surface (top surface in FIG. 1) of the third base layer 13 independently of each other. The conductive patterns 13A and 13B are one example of the "low-flow members". The third base layer 13 is stacked on the second base layer 12 such that the principal surface on which the conductive patterns 13A and 13B are disposed faces the second base layer 12. Each of the conductive patterns 13A and 13B preferably has a strip shape. The conductive patterns 13A and 13B are wound so as to surround the regions P1 and P2, respectively. The conductive patterns 13A and 13B have no portions overlapping the regions P1 and P2. The conductive pattern 13A has one end connected to one end of the conductive pattern 12A with an interlayer connective conductor (not illustrated) interposed therebetween disposed on the second base layer 12. The conductive pattern 13B has one end connected to one end of the conductive pattern 12B with an interlayer connective conductor (not illustrated) interposed therebetween disposed on the second base layer 12.

Conductive patterns 14A and 14B are disposed on a first principal surface (top surface in FIG. 1) of the fourth base layer 14 independently of each other. The conductive patterns 14A and 14B are one example of the "low-flow members". The fourth base layer 14 is stacked on the third base layer 13 such that the principal surface on which the conductive patterns 14A and 14B are disposed faces the third base layer 13. Each of the conductive patterns 14A and 14B preferably has a strip shape. The conductive patterns 14A and 14B are wound so as to surround the regions P1 and P2, respectively. The conductive patterns 14A and 14B have no portions overlapping the regions P1 and P2. The conductive pattern 14A has one end connected to one end of the conductive pattern 13A with an interlayer connective conductor (not illustrated) interposed therebetween disposed on the third base layer 13. The conductive pattern 14B has one end connected to one end of the conductive pattern 13B with an interlayer connective conductor (not illustrated) interposed therebetween disposed on the third base layer 13.

A conductive pattern 15A is disposed on a first principal surface (top surface in FIG. 1) of the fifth base layer 15. The conductive pattern 15A is one example of the "low-flow members". The fifth base layer 15 is stacked on the fourth base layer 14 such that the principal surface on which the conductive pattern 15A is disposed faces the fourth base layer 14. The conductive pattern 15A preferably has a strip shape and is wound so as to surround the regions P1 and P2. The conductive pattern 15A has no portion overlapping the regions P1 and P2. The conductive pattern 15A has one end and another end connected to one end of the conductive pattern 14A and one end of the conductive pattern 14B, respectively, with interlayer connective conductors (not illustrated) interposed therebetween disposed on the fourth base layer 14.

Interlayer connective conductors (not illustrated) disposed on the layers are one example of the "low-flow members".

The conductive patterns in the multilayer body 10 define a single coil using the conductive patterns 11A and 11B as its input and output ends and wound around a winding axis being the stacking direction. Specifically, the conductive patterns 12A, 13A, and 14A define a coil section wound in the same direction around a winding axis being the stacking direction, and the conductive patterns 12B, 13B, and 14B define a coil section wound in the same direction around a winding axis being the stacking direction. These two coil sections are connected together by the conductive pattern 15A and define the single coil.

The conductive patterns disposed on the base layers 12 to 15 are wound so as to surround the regions P1 and P2. More specifically, the conductive patterns 12A and 12B on the second base layer 12 include portions located in the regions P1 and P2, respectively, and the other conductive patterns are located in the region surrounding the regions P1 and P2. Accordingly, the number of the stacked conductive patterns in the regions P1 and P2 is smaller than that in the region surrounding the regions P1 and P2. In other words, the proportion of the conductive patterns in the regions P1 and P2 is lower than that in the region surrounding the regions P1 and P2.

Figure 3:
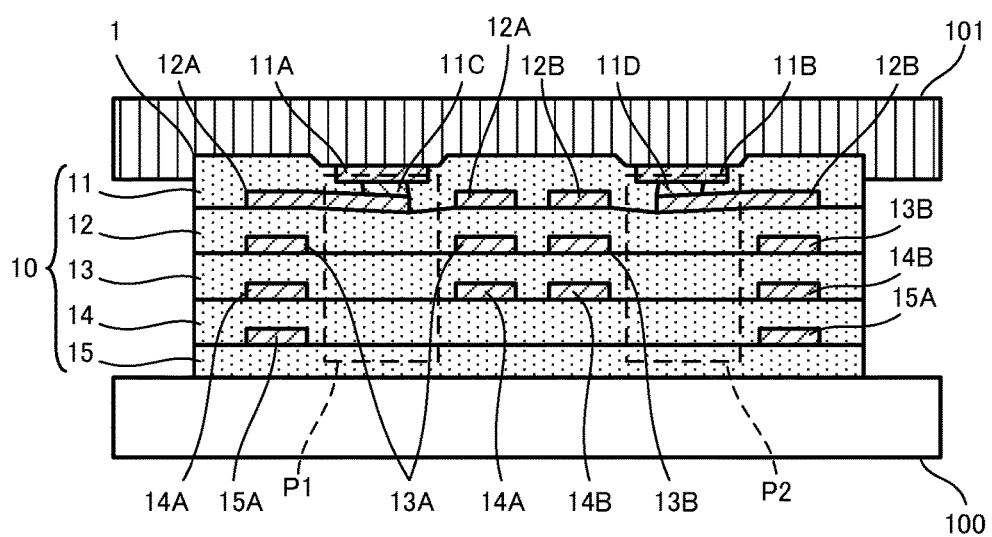
FIG. 3 illustrates a state of a multilayer body after thermocompression bonding.

The multilayer substrate 1 is formed preferably by forming the conductive patterns on the base layers 11 to 15, then stacking the base layers 11 to 15, and laminating the base layers 11 to 15 in the stacking direction by thermocompression bonding. FIG. 3 illustrates a state of the multilayer body 10 after thermocompression bonding. In thermocompression bonding, a metal rigid body 100 is pressed from the side of the fifth base layer 15, and an elastic body 101 is pressed from the side of the first base layer 11. Examples of the material of the elastic body 101 may include a silicon resin or silicon rubber.

As described above, the proportion of the conductive patterns in the regions P1 and P2 overlapping the conductive patterns 11A and 11B on the first base layer 11 in the stacking direction is lower than that in the region surrounding the regions P1 and P2. Accordingly, the flowability in the regions P1 and P2 in the stacking direction is high, whereas that in the other region in the stacking direction is low. When the elastic body 101 is pressed against this multilayer body 10 having different flowabilities from the side of the first base layer 11, the elastic body 101 is deformed in the low-flow region surrounding the regions P1 and P2, whereas the regions P1 and P2 are deformed in the stacking direction in the high-flow regions P1 and P2.

Concretely, in the low-flow region other than the regions P1 and P2, when it is pressed by the elastic body 101, it is not easily recessed. In contrast to this, in the high-flow regions P1 and P2, when it is pressed by the elastic body 101, the pressed portion is recessed inwardly along the stacking direction. Thus, the conductive patterns 11A and 11B in the regions P1 and P2 are depressed inwardly along the stacking direction, and the conductive patterns 11A and 11B are located inwardly from the surface of the multilayer body 10. Recessed portions 10A and 10B recessed inwardly from the surface of the multilayer body 10 are formed around the conductive patterns 11A and 11B, respectively. That is, the conductive patterns 11A and 11B are located at the bottom of the recessed portions 10A and 10B, respectively, which are disposed in the surface of the multilayer body 10.

In thermocompression bonding, when the conductive patterns 11A and 11B are depressed inwardly along the stacking direction, the interlayer connective conductors 11C and 11D and portions in the conductive patterns 12A and 12B that are in locations overlapping the conductive patterns 11A and 11B in the stacking direction are also depressed inwardly. Thus, as illustrated in FIGS. 2 and 3, portions in the conductive patterns 12A and 12B are more inclined with respect to the horizontal direction (direction perpendicular or substantially perpendicular to the stacking direction) than the other portions.

Examples of the material of the elastic body 101 may include a silicon resin or silicon rubber. The elastic body 101 may preferably be made of a material having a modulus of elasticity at which it is deformed in accordance with the magnitude of the flowability in pressing the base layers 11 to 15 in thermocompression bonding, as previously described.

Figure 4:
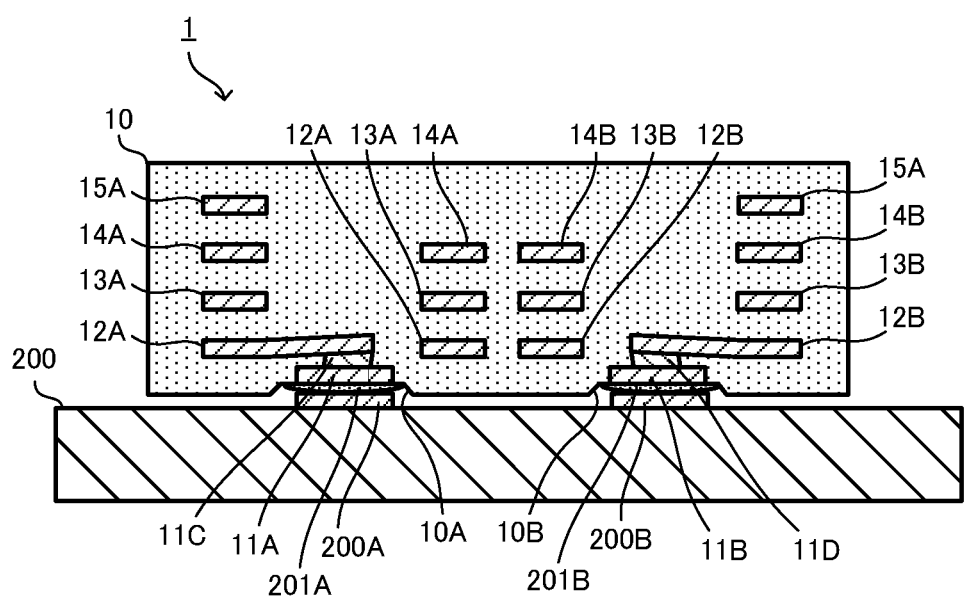
FIG. 4 is a cross-sectional view that illustrates a state in which the multilayer substrate is mounted on a circuit board.
Figure 5:
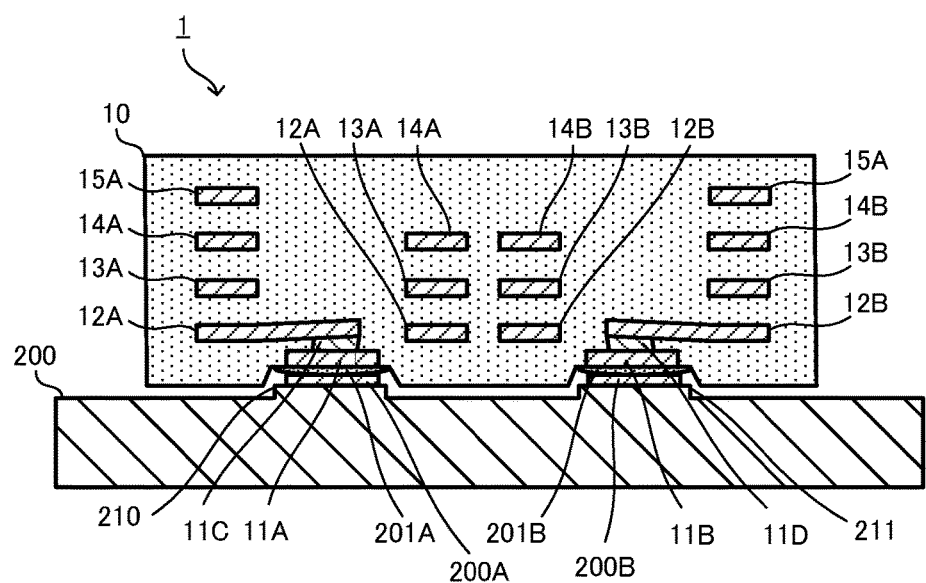
FIG. 5 is a cross-sectional view that illustrates a state in which the multilayer substrate is mounted on the circuit board.

FIGS. 4 and 5 are cross-sectional views that illustrate states where the multilayer substrate 1 is mounted on a circuit board 200. One example of the circuit board 200 may be a collective board. Because the conductive patterns 11A and 11B, which are the mounting electrodes in the multilayer substrate 1, are located at the bottom of the recessed portions 10A and 10B in the surface of the multilayer body 10, in mounting the multilayer substrate 1 to mounting electrodes 200A and 200B in the circuit board 200, the multilayer substrate 1 preferably is arranged such that the mounting electrodes 200A and 200B are fit in the recessed portions 10A and 10B, respectively. Thus, the multilayer substrate 1 is able to be accurately positioned relative to the mounting electrodes 200A and 200B.

Solder portions 201A and 201B used in mounting the conductive patterns 11A and 11B on the mounting electrodes 200A and 200B remain within the recessed portions 10A and 10B, respectively, and thus the amount of protrusion of the solder portions 201A and 201B from the multilayer substrate 1 is able to be reduced. Accordingly, failures such as shorts with other circuits caused by protrusion of the solder are significantly reduced or prevented. Additionally, the expansion of the solder portions 201A and 201B is significantly reduced or prevented, thus the advantages offered by self-alignment are enhanced, and the deviation of the mounting location of the multilayer substrate 1 is significantly reduced or prevented.

As illustrated in FIG. 5, projecting portions 210 and 211 are provided in portions in the circuit board 200 where the mounting electrodes 200A and 200B are located, and the multilayer substrate 1 is able to be arranged such that the projecting portions 210 and 211 are fit in the recessed portions 10A and 10B, respectively, in the multilayer body 10. Thus, the multilayer substrate 1 is able to be more accurately positioned relative to the mounting electrodes 200A and 200B.

A non-limiting example of a method for manufacturing the multilayer substrate 1 is described below.

Copper foil is attached on a first principal surface of a thermoplastic resin sheet or a sheet with copper attached to one side is prepared. Then, the copper foil is patterned by using a resist in accordance with a conductive pattern to be formed. Conductive patterns are formed by etching, and the resist is removed. Places (places where the cooper foil is removed by the above etching) are radiated with a laser beam from the side of the other surface of the resin sheet (surface without copper foil) to form holes, and the holes (via holes) are filled with conductive paste. This step corresponds to a "mounting-electrode forming step".

In forming the conductive patterns, the conductive patterns are formed on the base layers 12 to 15 in the regions P1 and P2 overlapping the conductive patterns 11A and 11B, which are formed on the first base layer 11 and are to be mounting electrodes, in the stacking direction, so as to reduce the conductive patterns. Concretely, the conductive patterns are formed on the base layers 12 to 15 such that the proportion of the conductive patterns in the regions P1 and P2 is lower than that in the region surrounding the regions P1 and P2. Thus, the flowability in the regions P1 and P2 is higher than that in the region surrounding the regions P1 and P2 in the stacking direction.

Each of the conductive patterns formed on the base layers 12 to 15 is a low-flow member that has flowability lower than that in the base layers 11 to 15 at a temperature in thermocompression bonding.

Next, the base layers 11 to 15 are stacked in sequence such that the first principal surface of the first base layer 11 on which the conductive patterns 11A and 11B are disposed is the outermost surface (stacking step). At this time, they are positioned in consideration of the positional relationship between the interlayer connective conductors on the base layers and the conductive patterns. In this way, the base layers 11 to 15 are stacked, and the multilayer body 10 is formed. The metal rigid body 100 is pressed against the multilayer body 10 from the side of the fifth base layer 15, the elastic body 101 is pressed against the multilayer body 10 from the side of the first base layer 11, and the base layers 11 to 15 are laminated by thermocompression bonding (thermocompression bonding step). Thus, the high-flow regions P1 and P2 are depressed inwardly in the stacking direction, the recessed portions 10A and 10B are formed in the surface of the multilayer body 10, and the conductive patterns 11A and 11B are located inwardly from the surface of the multilayer body 10. In the present preferred embodiment, because the via holes are filled with the conductive paste, they are able to be deformed more easily than via holes formed by plating, and the multilayer body 10 is recessed easily.

The resin sheet is thermoplastic, as described above, and there is no need to use adhesive. In this heating and pressing process, the interlayer connective conductors and corresponding conductors are bonded together. In this way, the multilayer substrate 1 illustrated in FIG. 2 is able to be manufactured through the above-described simple steps.

As described above, the multilayer substrate 1 has the recessed portions 10A and 10B, and the conductive patterns 11A and 11B being the mounting electrodes are formed at the bottom of the recessed portions 10A and 10B, respectively. This enables the multilayer substrate 1 to be accurately positioned relative to the mounting electrodes 200A and 200B. In addition, because the solder portions 201A and 201B remain within the recessed portions 10A and 10B, respectively, the amount of protrusion of the solder portions 201A and 201B from the multilayer substrate 1 is significantly reduced. This significantly reduces or prevents failures such as shorts with other circuits caused by protrusion of the solder portions 201A and 201B. The expansion of the solder portions 201A and 201B is significantly reduced, thus the advantages offered by self-alignment are enhanced, and the deviation of the mounting location is significantly reduced or prevented.

The recessed portions 10A and 10B preferably are formed simply by reducing the proportion of the conductive patterns in the regions P1 and P2 and by pressure bonding using the elastic body 101, and the multilayer substrate 1 is able to be easily manufactured. Additionally, because it is not necessary to prepare other dedicated members in the multilayer body 10 to form the recessed portions 10A and 10B, the profile of the multilayer substrate 1 is significantly reduced. Furthermore, because the multilayer substrate 1 is an inductor element incorporating a coil, the inductor element capable of suppressing the deviation of the mounting location is achieved.

In the present preferred embodiment, only the conductive patterns 12A and 12B preferably are partly located in the regions P1 and P2, respectively, for example. The other conductive patterns 13A, 13B, 14A, 14B, and 15A may be located in the regions P1 and P2. In this case, it is merely required that the proportion of the conductive patterns in the regions P1 and P2 be lower than that in the other region. When the conductive patterns 13A, 13B, 14A, 14B, and 15A are located in the regions P1 and P2, the size (amount of depression) of the recessed portions 10A and 10B are able to be adjusted in forming the recessed portions 10A and 10B.

For example, when the proportion of the conductive patterns in the regions P1 and P2 is increased, the amount of depression in the regions P1 and P2 by the elastic body 101 is reduced, and the recessed portions 10A and 10B are able to be small. When the proportion of the conductive patterns in the regions P1 and P2 is reduced, the amount of depression in the regions P1 and P2 by the elastic body 101 is increased, and the recessed portions 10A and 10B are large.

Second Preferred Embodiment

Figure 6:
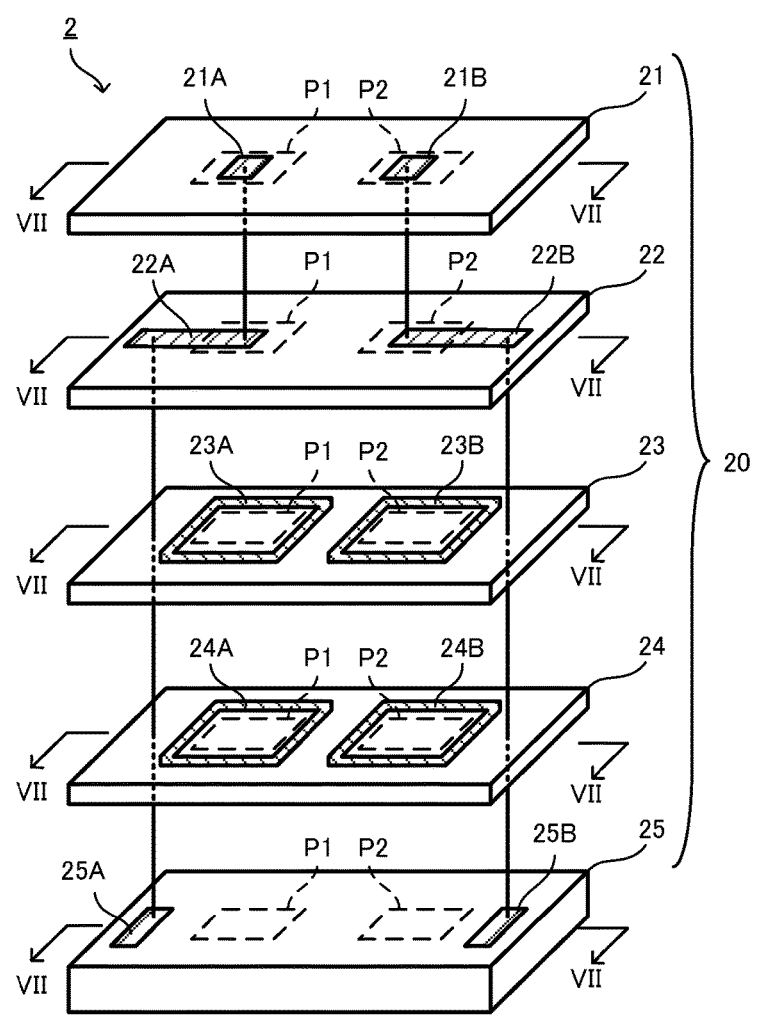
FIG. 6 is an exploded perspective view of a multilayer substrate according to a second preferred embodiment of the present invention.
Figure 7:
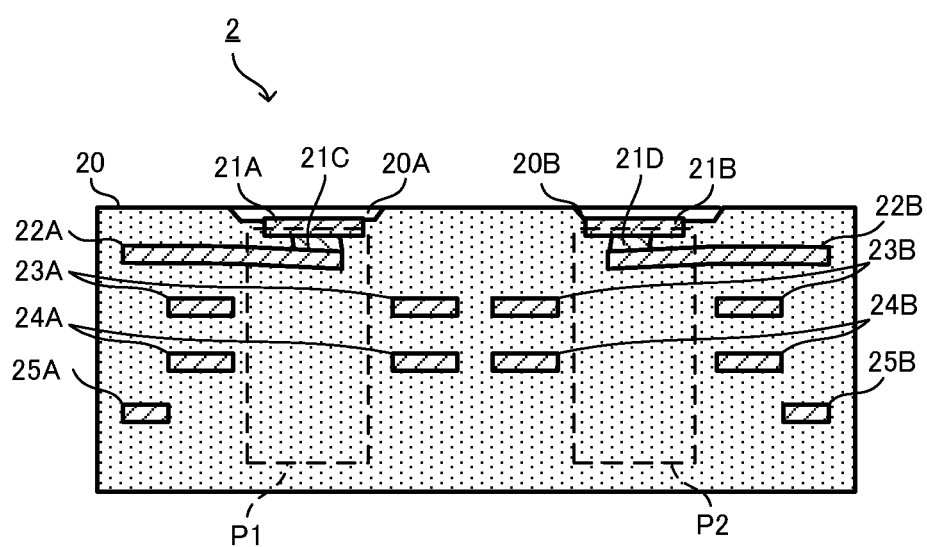
FIG. 7 is a cross-sectional view taken along the line VII-VII illustrated in FIG. 6.

FIG. 6 is an exploded perspective view of a multilayer substrate 2 according to a second preferred embodiment of the present invention. FIG. 7 is a cross-sectional view taken along the line VII-VII illustrated in FIG. 6.

In the first preferred embodiment, the recessed portions 10A and 10B are formed by using the conductive patterns constituting the coil. In contrast, in the present preferred embodiment, recessed portions 20A and 20B are provided in a multilayer body 20 by using dummy patterns 23A, 23B, 24A, and 24B. The dummy patterns 23A, 23B, 24A, and 24B are not related to circuit wiring, are electrically independent patterns, and have flowability lower than that in a thermoplastic resin at a temperature in pressure bonding of that thermoplastic resin. The dummy patterns 23A, 23B, 24A, and 24B may be conductors or may be nonconductors, such as ceramics.

The multilayer substrate 2 includes the multilayer body 20. The multilayer body 20 is formed preferably by stacking a first base layer 21, second base layer 22, third base layer 23, fourth base layer 24, and fifth base layer 25 in sequence and laminating them by thermocompression bonding. Each of the base layers 21 to 25 has a rectangular or substantially rectangular shape having long sides and short sides. The multilayer body 20 preferably has a rectangular or substantially rectangular parallelepiped shape. Each of the base layers 21 to is formed such that an insulating thermoplastic resin, for example, liquid crystal polymer (LCP) resin, is used as a mother material.

Rectangular or substantially rectangular conductive patterns 21A and 21B are disposed on a first principal surface (top surface in FIG. 6) of the first base layer 21. The conductive patterns 21A and 21B are one example of the "mounting electrode" and are also one example of the "low-flow members". The first base layer 21 is the outermost layer in the multilayer body 20. The multilayer substrate 2 is mounted on a circuit board or other element such that its mounting surface is the principal surface of the first base layer 21 on which the conductive patterns 21A and 21B are disposed. The conductive patterns 21A and 21B are used as the mounting electrodes in the multilayer substrate 2.

Interlayer connective conductors 21C and 21D are disposed on the first base layer 21 at locations that overlap the conductive patterns 21A and 21B as seen in plan view. The interlayer connective conductors 21C and 21D are one example of the "low-flow members".

As with the first preferred embodiment, in the present preferred embodiment, a region that surrounds the conductive pattern 21A and regions that overlap the region in the stacking direction of the multilayer body 20 are indicated by P1, and a region that surrounds the conductive pattern 21B and regions that overlap the region in the stacking direction of the multilayer body 20 are indicated by P2.

Conductive patterns 22A and 22B are disposed on a first principal surface (top surface in FIG. 6) of the second base layer 22 independently of each other. The second base layer 22 is stacked on the first base layer 21 such that the principal surface on which the conductive patterns 22A and 22B are disposed faces the first base layer 21. Each of the conductive patterns 22A and 22B preferably has a strip shape. The conductive pattern 22A has one end in the region P1 and is extended from that location to outside the region P1. The conductive pattern 22B has one end in the region P2 and is extended from that location to outside the region P2. The end of the conductive pattern 22A located in the region P1 is conductively connected to the conductive pattern 21A with the interlayer connective conductor 21C interposed therebetween disposed on the first base layer 21. The end of the conductive pattern 22B located in the region P2 is conductively connected to the conductive pattern 21B with the interlayer connective conductor 21D interposed therebetween disposed on the first base layer 21.

The dummy patterns 23A and 23B are disposed on the third base layer 23 independently of each other. The dummy patterns 23A and 23B are one example of the "low-flow members". The third base layer 23 is stacked on the second base layer 22 such that the principal surface on which the dummy patterns 23A and 23B are disposed faces the second base layer 22. Each of the dummy patterns 23A and 23B preferably has a strip shape. The dummy patterns 23A and 23B are wound so as to surround the regions P1 and P2, respectively. The dummy patterns 23A and 23B are independent of the conductive patterns disposed on the other base layers 21, 22, 24, and 25.

The dummy patterns 24A and 24B are disposed on the fourth base layer 24 independently of each other. The dummy patterns 24A and 24B are one example of the "low-flow members". The fourth base layer 24 is stacked on the third base layer 23 such that the principal surface on which the dummy patterns 24A and 24B are disposed faces the third base layer 23. Each of the dummy patterns 24A and 24B has a strip shape. The dummy patterns 24A and 24B are wound so as to surround the regions P1 and P2, respectively. The dummy patterns 24A and 24B are independent of the conductive patterns disposed on the other base layers 21 to 23 and 25.

Conductive patterns 25A and 25B are disposed on a first principal surface (top surface in FIG. 6) of the fifth base layer 25 outside the regions P1 and P2, respectively. The conductive patterns 25A and 25B are one example of the "low-flow members". The fifth base layer 25 is stacked on the fourth base layer 24 such that the principal surface on which the conductive patterns 25A and 25B are disposed faces the fourth base layer 24. The conductive patterns 25A and 25B are conductively connected to the conductive patterns 22A and 22B, respectively, on the second base layer 22 with interlayer connective conductors (not illustrated) interposed therebetween disposed on the third base layer 23 and fourth base layer 24.

The fifth base layer 25 includes a plurality of thermoplastic resin layers being stacked. The plurality of thermoplastic resin layers are provided with conductive patterns formed on their surfaces. The fifth base layer 25 incorporates a coil.

The conductive patterns 25A and 25B, which are formed on the first principal surface of the fifth base layer 25, are connected to ends of the incorporated coil. That is, the coil incorporated in the fifth base layer 25 in the multilayer substrate 2 uses the conductive patterns 21A and 21B as its input and output ends and is conductively connected to the conductive patterns 21A and 21B with the conductive patterns 22A, 22B, 25A, and 25B interposed therebetween.

The coil in the fifth base layer 25 may preferably be formed such that the proportion of the conductive patterns in the region overlapping the regions P1 and P2 is low.

As with the first preferred embodiment, the proportion of the conductive patterns in the regions P1 and P2 in the present preferred embodiment is lower than that in the region surrounding the regions P1 and P2. The multilayer substrate 2 having the recessed portions 20A and 20B formed in the surface is manufactured preferably by stacking the base layers 21 to 25, pressing the metal rigid body from the side of the fifth base layer 25, pressing the elastic body from the side of the first base layer 21, and laminating the base layers 21 to 25 by thermocompression bonding. By forming the recessed portions 20A and 20B and making the conductive patterns 21A and 21B being the mounting electrodes be located inwardly from the surface, the multilayer substrate 2 is able to be accurately positioned relative to the mounting electrodes on the circuit board. In addition, because the solder remains within the recessed portions 20A and 20B, the amount of protrusion of the solder from the multilayer substrate 2 is significantly reduced or prevented. Thus, failures such as shorts with other circuits caused by protrusion of solder are significantly reduced or prevented. Additionally, the expansion of the solder is significantly reduced, thus the advantages offered by self-alignment are enhanced, and the deviation of the mounting location is significantly reduced or prevented.

In the present preferred embodiment, in which the dummy patterns 23A, 23B, 24A, and 24B are provided, the proportion of the conductive patterns in the region surrounding the regions P1 and P2 preferably is higher than that in the case where no dummy patterns are disposed. Thus, when the elastic body is pressed from the side of the first base layer 21, the recessed portions 20A and 20B are easily formed in the regions P1 and P2.

Third Preferred Embodiment

Figure 8:
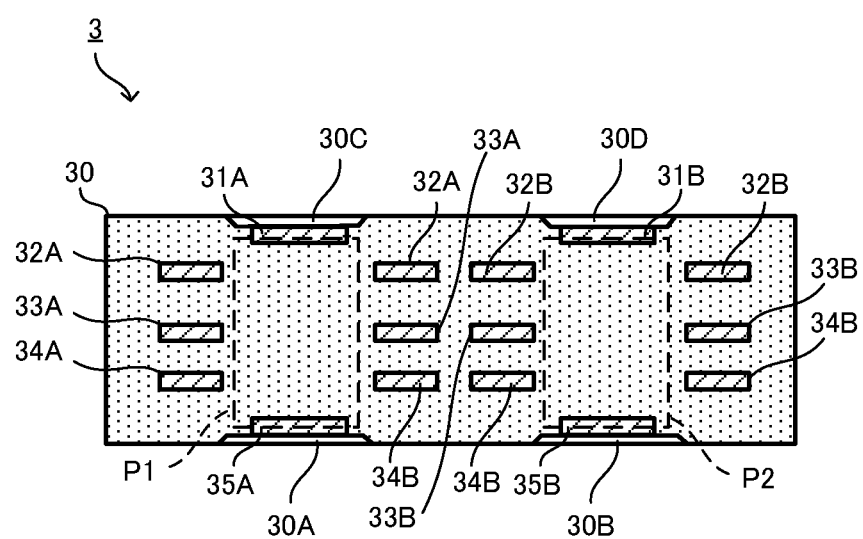
FIG. 8 is a cross-sectional view of a multilayer substrate according to a third preferred embodiment of the present invention.
Figure 9:
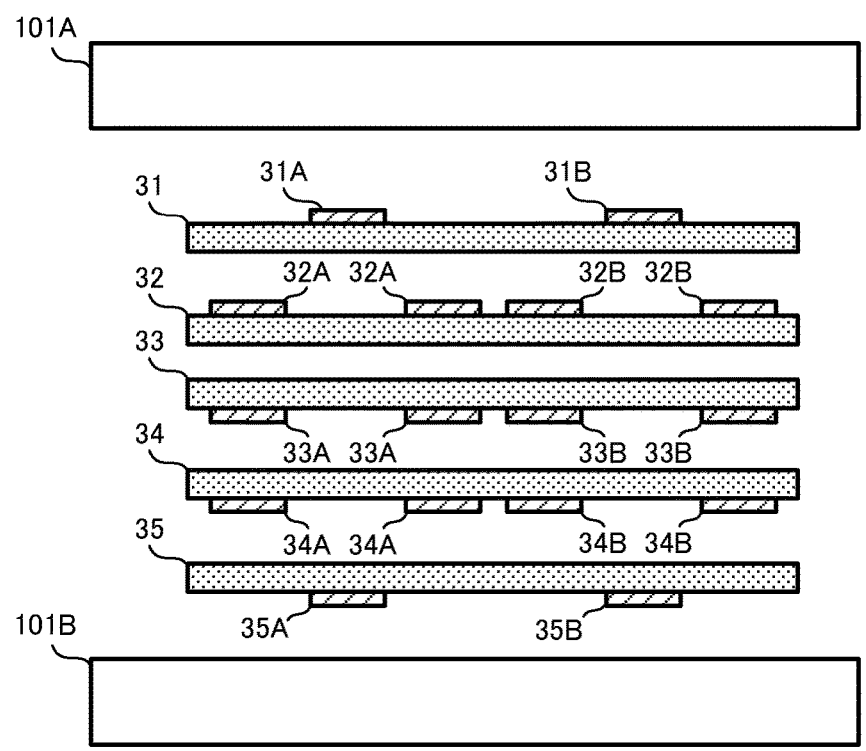
FIG. 9 is an exploded view of the multilayer substrate according to the third preferred embodiment of the present invention.

FIG. 8 is a cross-sectional view of a multilayer substrate 3 according to a third preferred embodiment of the present invention. FIG. 9 is an exploded view of the multilayer substrate 3 according to the third preferred embodiment. In the first and second preferred embodiments, the recessed portions are formed on only the first principal surface of the multilayer body. In contrast, in the present preferred embodiment, the recessed portions are formed on both principal surfaces of a multilayer body 30. In the multilayer substrate 3 according to the present preferred embodiment, two coils are disposed in the multilayer body 30 independently of each other.

The multilayer substrate 3 is formed preferably by laminating a first base layer 31, second base layer 32, third base layer 33, fourth base layer 34, and fifth base layer 35 stacked in the multilayer body 30 by thermocompression bonding.

Rectangular or substantially rectangular conductive patterns 31A and 31B are disposed on a first principal surface (top surface in FIG. 9) of the first base layer 31. The conductive patterns 31A and 31B are one example of the "mounting electrode" and are also one example of the "low-flow members". The first base layer 31 is the outermost layer in the multilayer body 30.

As with the first and second preferred embodiments, in the present preferred embodiment, a region that surrounds the conductive pattern 31A and regions that overlap the region in the stacking direction of the multilayer body 30 are indicated by P1, and a region that surround the conductive pattern 31B and regions that overlap the region in the stacking direction of the multilayer body 30 are indicated by P2.

Conductive patterns 32A and 32B are disposed on a first principal surface (top surface in FIG. 9) of the second base layer 32 independently of each other. The second base layer 32 is stacked on the first base layer 31 such that the principal surface on which the conductive patterns 32A and 32B are disposed faces the first base layer 31. Each of the conductive patterns 32A and 32B preferably has a strip shape, which is not illustrated, as with the first preferred embodiment. The conductive pattern 32A has one end in the region P1, is extended from that location, and is wound so as to surround the region P1. The conductive pattern 32B has one end in the region P2, is extended from that location, and is wound so as to surround the region P2. The end of the conductive pattern 32A located in the region P1 is conductively connected to the conductive pattern 31A with an interlayer connective conductor (not illustrated) interposed therebetween disposed on the first base layer 31. The end of the conductive pattern 32B located in the region P2 is conductively connected to the conductive pattern 31B with an interlayer connective conductor (not illustrated) interposed therebetween disposed on the first base layer 31.

The conductive patterns 32A and 32B are one example of the "low-flow members". Each of the conductive patterns 32A and 32B has flowability lower than that in the base layers 31 to 35 in the multilayer body 30 at a temperature in thermocompression bonding.

Conductive patterns 33A and 33B are disposed on a first principal surface (bottom surface in FIG. 9) of the third base layer 33 independently of each other. The conductive patterns 33A and 33B are one example of the "low-flow members". The third base layer 33 is stacked on the second base layer 32 such that the principal surface (top surface in FIG. 9) opposite the principal surface on which the conductive patterns 33A and 33B are disposed faces the second base layer 32. Each of the conductive patterns 33A and 33B preferably has a strip shape. The conductive patterns 33A and 33B are wound so as to surround the regions P1 and P2, respectively. The conductive pattern 33A has one end connected to one end of the conductive pattern 32A with interlayer connective conductors (not illustrated) interposed therebetween disposed on the second base layer 32 and third base layer 33. The conductive pattern 33B has one end connected to one end of the conductive pattern 32B with interlayer connective conductors (not illustrated) interposed therebetween disposed on the second base layer 32 and third base layer 33.

Conductive patterns 34A and 34B are disposed on a first principal surface (bottom surface in FIG. 9) of the fourth base layer 34 independently of each other. The conductive patterns 34A and 34B are one example of the "low-flow members". The fourth base layer 34 is stacked on the third base layer 33 such that the principal surface (top surface in FIG. 9) opposite the principal surface on which the conductive patterns 34A and 34B are disposed faces the third base layer 33. Each of the conductive patterns 34A and 34B preferably has a strip shape. The conductive patterns 34A and 34B are wound so as to surround the regions P1 and P2, respectively. The conductive pattern 34A has one end connected to one end of the conductive pattern 33A with an interlayer connective conductor (not illustrated) interposed therebetween disposed on the fourth base layer 34. The conductive pattern 34B has one end connected to one end of the conductive pattern 33B with an interlayer connective conductor (not illustrated) interposed therebetween disposed on the fourth base layer 34.

Conductive patterns 35A and 35B are disposed on a first principal surface (bottom surface in FIG. 9) of the fifth base layer 35. The conductive patterns 35A and 35B are one example of the "low-flow members". The conductive patterns 35A and 35B are disposed at locations substantially overlapping the conductive patterns 31A and 31B in the stacking direction. The fifth base layer 35 is the outermost layer in the multilayer body 30. The fifth base layer 35 is stacked on the fourth base layer 34 such that the principal surface (top surface in FIG. 9) opposite the principal surface on which the conductive patterns 35A and 35B are disposed faces the fourth base layer 34. The conductive pattern 35A has one end connected to one end of the conductive pattern 34A with an interlayer connective conductor (not illustrated) interposed therebetween disposed on the fifth base layer 35. The conductive pattern 35B has one end connected to one end of the conductive pattern 34B with an interlayer connective conductor (not illustrated) interposed therebetween disposed on the fifth base layer 35.

The conductive patterns 31A, 32A, 33A, 34A, and 35A disposed on the base layers 31 to 35 in the multilayer body 30 define a single coil in which the conductive patterns 31A and 35A are used as its input and output ends. The conductive patterns 31B, 32B, 33B, 34B, and 35B disposed on the base layers 31 to 35 in the multilayer body 30 define a single coil in which the conductive patterns 31B and 35B are used as its input and output ends. That is, the two independent coils in which their winding axes are the stacking direction are provided in the multilayer body 30.

As with the first and second preferred embodiments, in the present preferred embodiment, the proportion of the conductive patterns in the regions P1 and P2 is lower than that in the region surrounding the regions P1 and P2. The multilayer substrate 3 including recessed portions 30A, 30B, 30C, and 30D in the surface is manufactured by stacking the base layers 31 to 35, pressing elastic bodies 101A and 101B from the side of the first base layer 31 and the side of the fifth base layer 35, respectively, and laminating the base layers 31 to 35 by thermocompression bonding.

Figure 10:
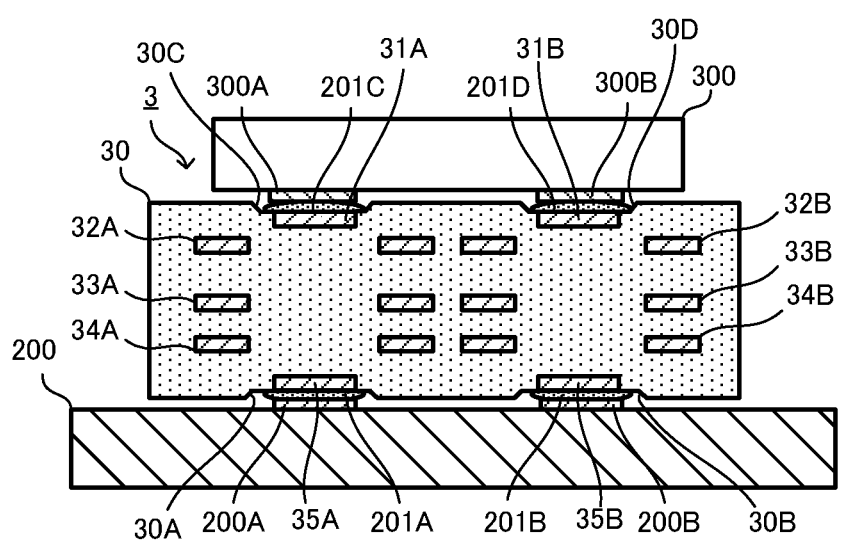
FIG. 10 is a perspective view that illustrates a state in which the multilayer substrate is mounted on the circuit board.

FIG. 10 is a cross-sectional view that illustrates a state in which the multilayer substrate 3 is mounted on the circuit board 200.

An electronic component 300 is mounted on the principal surface of the multilayer body 30 on which the conductive patterns 31A and 31B are disposed. At this time, electrodes 300A and 300B in the electronic component 300 are mounted on the conductive patterns 31A and 31B with solder portions 201C and 201D. The multilayer substrate 3 is mounted on the circuit board 200 such that the principal surface of the multilayer body 30 on which the conductive patterns 35A and 35B are disposed is the mounting surface. At this time, the conductive patterns 35A and 35B are mounted on the mounting electrodes 200A and 200B in the circuit board 200 with the solder portions 201A and 201B.

The recessed portions 30A and 30B are provided, the conductive patterns 35A and 35B, which are the mounting electrodes, are located inwardly from the surface of the multilayer body 30, and thus the multilayer substrate 3 is accurately positioned relative to the mounting electrodes 200A and 200B in the circuit board 200. In addition, because the solder portions 201A and 201B remain within the recessed portions 30A and 30B, the amount of protrusion of the solder portions 201A and 201B from the multilayer substrate 3 is significantly reduced. Thus, failures such as shorts with other circuits caused by protrusion of the solder portions 201A and 201B are significantly reduced or prevented.

Similarly, the recessed portions 30C and 30D are formed, the conductive patterns 31A and 31B, which are the mounting electrodes, are located inwardly from the surface of the multilayer body 30, and thus the electronic component 300 is accurately positioned relative to the multilayer substrate 3. In addition, because the solder portions 201C and 201D remain within the recessed portions 30C and 30D, the amount of protrusion of the solder portions 201C and 201D from the multilayer substrate 3 is significantly reduced. Thus, failures such as shorts with other circuits caused by protrusion of the solder portions 201C and 201D are significantly reduced or prevented.

Fourth Preferred Embodiment

Figure 11:
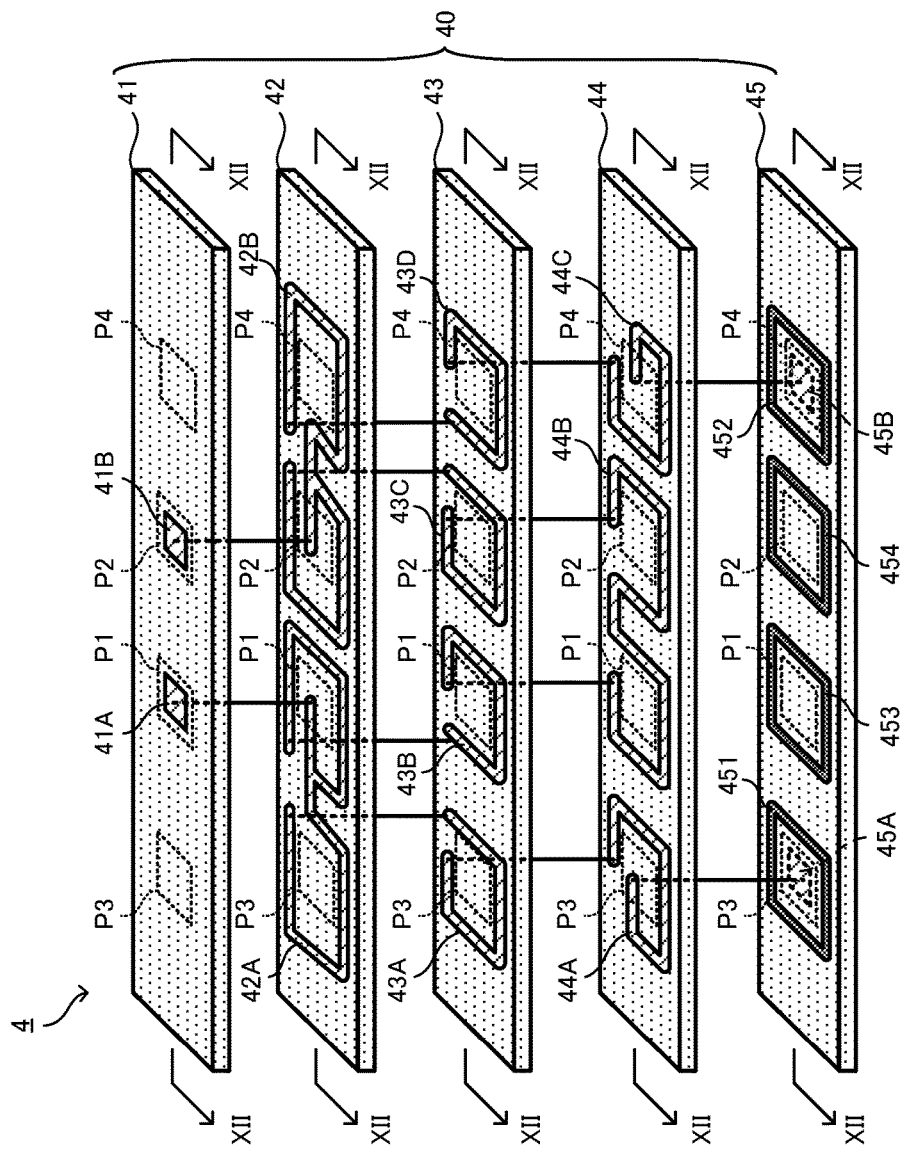
FIG. 11 is an exploded perspective view of a multilayer substrate according to a fourth preferred embodiment of the present invention.
Figure 12:
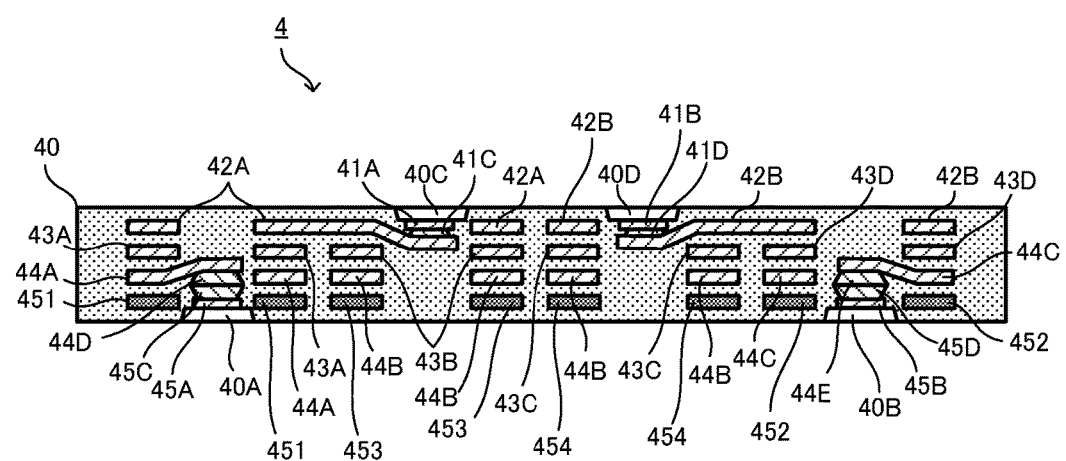
FIG. 12 is a cross-sectional view of the multilayer substrate taken along the line XII-XII illustrated in FIG. 11.

FIG. 11 is an exploded perspective view of a multilayer substrate 4 according to a fourth preferred embodiment of the present invention. FIG. 12 is a cross-sectional view of the multilayer substrate 4 taken along the line XII-XII illustrated in FIG. 11. As with the third preferred embodiment, in the present preferred embodiment, conductive patterns 41A and 41B being the mounting electrodes are formed on a first principal surface of a multilayer body 40 in the multilayer substrate 4, and conductive patterns 45A and 45B are formed on a second principal surface thereof. The conductive patterns 41A and 45A are in different locations in the stacking direction, and the conductive patterns 41B and 45B are in different locations in the stacking direction.

The multilayer body 40 is formed preferably by stacking a first base layer 41, second base layer 42, third base layer 43, fourth base layer 44, and fifth base layer 45 and laminating them by thermocompression bonding.

The rectangular or substantially rectangular conductive patterns 41A and 41B are disposed on a first principal surface (top surface in FIG. 11) of the first base layer 41. The rectangular or substantially rectangular conductive patterns 45A and 45B are disposed on a first principal surface (bottom surface in FIG. 11) of the fifth base layer 45. The conductive patterns 45A and 45B are different from the conductive patterns 41A and 41B in the stacking direction. The first base layer 41 and fifth base layer 45 are the outermost layers in the multilayer body 40. The conductive patterns 41A, 41B, 45A, and 45B are one example of the "mounting electrode" and also one example of the "low-flow members".

In the present preferred embodiment, a region that surrounds the conductive pattern 41A and regions that overlap the region in the stacking direction of the multilayer body 40 are indicated by P1, and a region that surrounds the conductive pattern 41B and regions that overlap the region in the stacking direction of the multilayer body 40 are indicated by P2. A region that surrounds the conductive pattern 45A and regions that overlap the region in the stacking direction of the multilayer body 40 are indicated by P3, and a region that surrounds the conductive pattern 45B and regions that overlap the region in the stacking direction of the multilayer body 40 are indicated by P4.

Conductive patterns 42A and 42B are disposed on a first principal surface (top surface in FIG. 11) of the second base layer 42 independently of each other. The conductive patterns 42A and 42B are one example of the "low-flow members". The second base layer 42 is stacked on the first base layer 41 such that the principal surface on which the conductive patterns 42A and 42B are disposed faces the first base layer 41.

The conductive pattern 42A preferably has a strip shape and includes a portion wound so as to surround the region P1 and a portion wound so as to surround the region P3, and these portions are conductively connected to each other. The portion wound so as to surround the region P1 includes a section located in the region P1, and that section is conductively connected to the conductive pattern 41A with an interlayer connective conductor 41C interposed therebetween disposed on the first base layer 41.

The conductive pattern 42B preferably has a strip shape and includes a portion wound so as to surround the region P2 and a portion wound so as to surround the region P4, and these portions are conductively connected to each other. The portion wound so as to surround the region P2 includes a section located in the region P2, and that section is conductively connected to the conductive pattern 41B with an interlayer connective conductor 41D interposed therebetween disposed on the first base layer 41.

The interlayer connective conductors 41C and 41D are one example of the "low-flow members".

Conductive patterns 43A, 43B, 43C, and 43D are disposed on a first principal surface (top surface in FIG. 11) of the third base layer 43 independently of each other. The conductive patterns 43A, 43B, 43C, and 43D are one example of the "low-flow members". The third base layer 43 is stacked on the second base layer 42 such that the principal surface on which the conductive patterns 43A, 43B, 43C, and 43D are disposed faces the second base layer 42.

The conductive pattern 43A preferably has a strip shape and is wound so as to surround the region P3. The conductive pattern 43A is conductively connected to the conductive pattern 42A with an interlayer connective conductor (not illustrated) interposed therebetween disposed on the second base layer 42. The conductive pattern 43B preferably has a strip shape and includes a portion wound so as to surround the region P1. The conductive pattern 43B is conductively connected to the conductive pattern 42A with an interlayer connective conductor (not illustrated) interposed therebetween disposed on the second base layer 42.

The conductive pattern 43C preferably has a strip shape and is wound so as to surround the region P2. The conductive pattern 43C is conductively connected to the conductive pattern 42B with an interlayer connective conductor (not illustrated) interposed therebetween disposed on the second base layer 42. The conductive pattern 43D preferably has a strip shape and is wound so as to surround the region P4. The conductive pattern 43D is conductively connected to the conductive pattern 42B with an interlayer connective conductor (not illustrated) interposed therebetween disposed on the second base layer 42.

Conductive patterns 44A, 44B, and 44C are disposed on a first principal surface (top surface in FIG. 11) of the fourth base layer 44 independently of each other. The conductive patterns 44A, 44B, and 44C are one example of the "low-flow members". The fourth base layer 44 is stacked on the third base layer 43 such that the principal surface on which the conductive patterns 44A, 44B, and 44C are disposed faces the third base layer 43.

The conductive pattern 44A preferably has a strip shape and is wound so as to surround the region P3. The conductive pattern 44A is conductively connected to the conductive pattern 43A with an interlayer connective conductor (not illustrated) interposed therebetween disposed on the third base layer 43. The conductive pattern 44B preferably has a strip shape and includes a portion wound so as to surround the region P1 and a portion wound so as to surround the region P2, and these portions are conductively connected to each other. The portion wound so as to surround the region P1 is conductively connected to the conductive pattern 43B with an interlayer connective conductor (not illustrated) interposed therebetween disposed on the third base layer 43. The portion wound so as to surround the region P2 is conductively connected to the conductive pattern 43C with an interlayer connective conductor (not illustrated) interposed therebetween disposed on the third base layer 43. The conductive pattern 44C preferably has a strip shape and is wound so as to surround the region P4. The conductive pattern 44C is conductively connected to the conductive pattern 43D with an interlayer connective conductor (not illustrated) interposed therebetween disposed on the third base layer 43.

Thermosetting resin dummy patterns 451, 452, 453, and 454 are disposed on a second principal surface (top surface in FIG. 11) of the fifth base layer 45. Because the dummy patterns 451, 452, 453, and 454 are cured by heating, they have flowability lower than that in the base layers 41 to 45 in thermocompression bonding. The dummy patterns 451, 452, 453, and 454 are one example of the "low-flow members". The fifth base layer 45 is stacked on the fourth base layer 44 such that the principal surface on which the dummy patterns 451, 452, 453, and 454 are disposed faces the fourth base layer 44.

The dummy patterns 451 and 452 are wound so as to surround the regions P3 and P4, respectively. Conductive patterns 45A and 45B disposed on a first principal surface of the fifth base layer 45 are connected to the conductive patterns 44A and 44C, respectively, with interlayer connective conductors 44D and 44E, respectively, on the fourth base layer 44 and interlayer connective conductors 45C and 45D, respectively, on the fifth base layer 45.

The dummy patterns 453 and 454 are wound so as to surround the regions P1 and P2, respectively.

The conductive patterns in the multilayer body 40 define three coils in which the conductive patterns 41A, 41B, 45A, and 45B are used as their input and output ends. Specifically, a first coil uses the conductive patterns 41A and 45A as the input and output ends and includes the conductive patterns 43A and 44A and the portion in the conductive pattern 42A wound so as to surround the region P3. The conductive patterns 43A and 44A and that portion in the conductive pattern 42A are wound in the same direction around a winding axis being the stacking direction.

A second coil uses the conductive patterns 41A and 41B as the input and output ends and is made up of two coil sections. The first coil section includes the portion in the conductive pattern 42A wound so as to surround the region P1, the conductive pattern 43B, and the portion in the conductive pattern 44B wound so as to surround the region P1, and these portions and the conductive pattern 43B are wound in the same direction. The second coil section includes the portion in the conductive pattern 44B wound so as to surround the region P2, the conductive pattern 43C, and the portion in the conductive pattern 42B wound so as to surround the region P2, and these portions and the conductive pattern 43C are wound in the same direction. The first and second coil sections are wound around a winding axis being the stacking direction, are connected together in the conductive pattern 44B, and define the second coil.

A third coil uses the conductive patterns 41B and 45B as the input and output ends and includes the conductive patterns 44C and 43D and the portion in the conductive pattern 42B wound so as to surround the region P4. The conductive patterns 44C and 43D and that portion in the conductive pattern 42B are wound in the same direction around a winding axis being the stacking direction and define the third coil.

The conductive patterns are disposed on the base layers 41 to 45, as described above. Thus, as with the first preferred embodiment, the proportion of the conductive patterns in the regions P1, P2, P3, and P4 in the present preferred embodiment, is lower than that in the region surrounding the regions P1, P2, P3, and P4. The dummy patterns 451, 452, 453, and 454 in the region surrounding the regions P1, P2, P3, and P4 are made of thermosetting resin and have flowability lower than that in the base layers 41 to 45 at a temperature in thermocompression bonding. Thus the dummy patterns 451, 452, 453, and 454 behave in the same or substantially the same manner as in the other conductive patterns in thermocompression bonding. As with the third preferred embodiment, the base layers 41 to 45 are stacked, an elastic body is pressed from each of the side of the first base layer 41 and the side of the fifth base layer 45, and the base layers 41 to 45 are laminated by thermocompression bonding. In this way, the multilayer substrate 4 having the recessed portions 40A, 40B, 40C, and 40D provided in the surface is manufactured.

Figure 13:
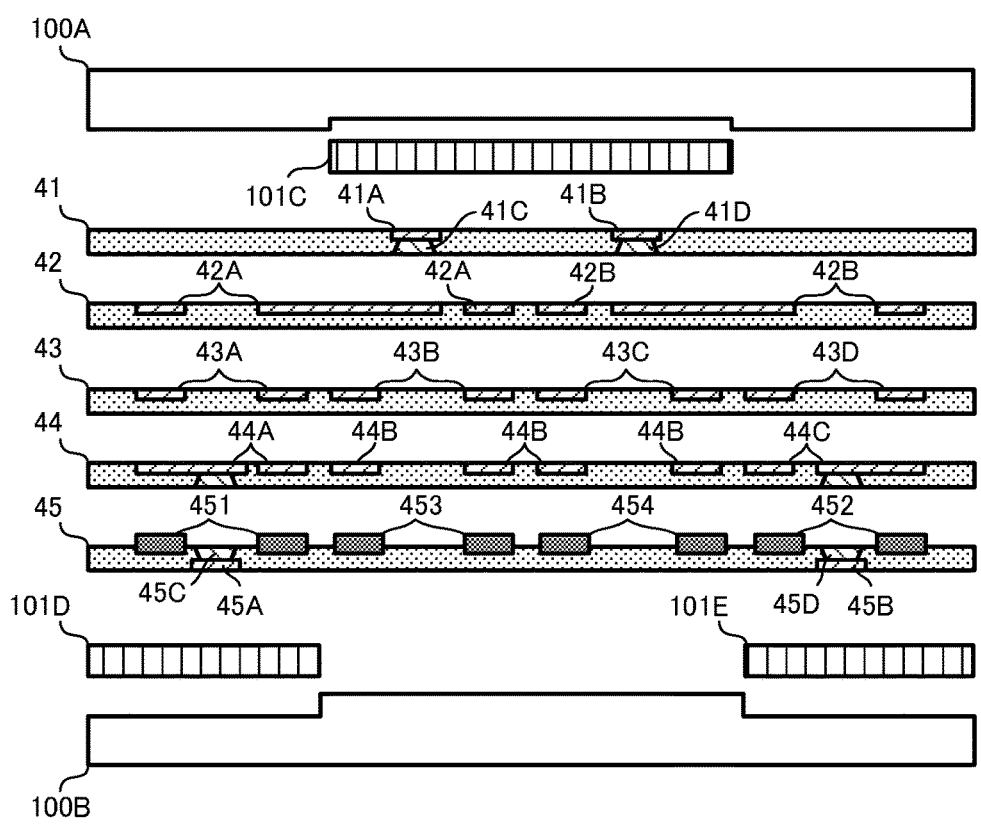
FIG. 13 is an exploded view of a multilayer body in thermocompression bonding.
Figure 14:
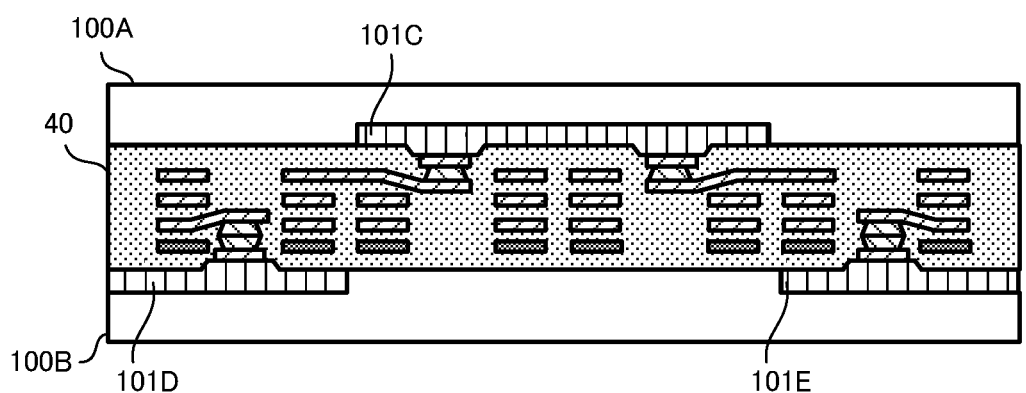
FIG. 14 illustrates a state of the multilayer body after thermocompression bonding.

FIG. 13 is an exploded view of the multilayer body 40 in thermocompression bonding. FIG. 14 illustrates a state of the multilayer body 40 after thermocompression bonding.

The multilayer substrate 4 is formed preferably by forming the conductive patterns on the base layers 41 to 45, stacking the base layers 41 to 45, and laminating the base layers 41 to 45 in the stacking direction by thermocompression bonding. In thermocompression bonding, in the regions P1 and P2, where the recessed portions 40C and 40D are to be provided, an elastic body 101C is pressed from the side of the first base layer 41, and a metal rigid body 101B is pressed from the side of the fifth base layer 45. In the regions P3 and P4, where the recessed portions 40A and 40B are to be provided, elastic bodies 101D and 101E are pressed from the side of the fifth base layer 45, and a metal rigid body 100A is pressed from the side of the first base layer 41.

Thus, the proportion of the conductive patterns in the regions P1, P2, P3, and P4 is lower than that in the region surrounding the regions P1, P2, P3, and P4. Accordingly, when the regions P1 and P2 are pressed by the elastic body 101C from the side of the first base layer 41, the pressed portions are recessed inwardly along the stacking direction. Thus, the conductive patterns 41A and 41B in the regions P1 and P2 are depressed inwardly along the stacking direction, and the conductive patterns 41A and 41B are located inwardly from the surface of the multilayer body 40. The recessed portions 40C and 40D recessed inwardly from the surface of the multilayer body 40 are disposed around the conductive patterns 41A and 41B, respectively.

When the regions P3 and P4 are pressed by the elastic bodies 101D and 101E from the side of the fifth base layer 45, the pressed portions are recessed inwardly along the stacking direction. Thus, the conductive patterns 45A and 45B in the regions P3 and P4 are depressed inwardly along the stacking direction, and the conductive patterns 45A and 45B are located inwardly from the surface of the multilayer body 40. The recessed portions 40A and 40B recessed inwardly from the surface of the multilayer body 40 are provided around the conductive patterns 45A and 45B, respectively.

Figure 15:
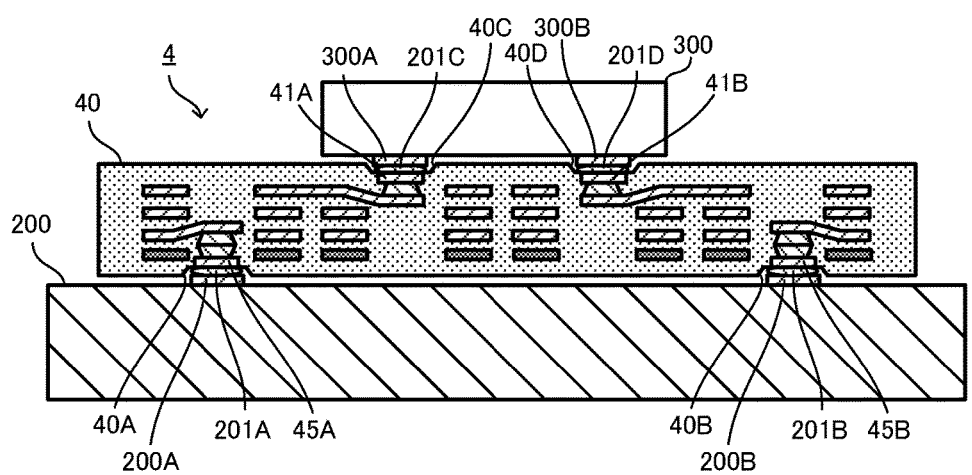
FIG. 15 is a cross-sectional view that illustrates a state in which the multilayer substrate is mounted on the circuit board.

FIG. 15 is a cross-sectional view that illustrates a state in which the multilayer substrate 4 is mounted on the circuit board 200.

As with the third preferred embodiment, the electronic component 300 is mounted on the principal surface of the multilayer body 40 on which the conductive patterns 41A and 41B are disposed. At this time, the electrodes 300A and 300B in the electronic component 300 are mounted on the conductive patterns 41A and 41B with the solder portions 201C and 201D. The multilayer substrate 4 is mounted on the circuit board 200 such that the principal surface of the multilayer body 40 on which the conductive patterns 45A and 45B are disposed is the mounting surface. At this time, the conductive patterns 45A and 45B are mounted on the mounting electrodes 200A and 200B in the circuit board 200 with the solder portions 201A and 201B.

The recessed portions 40A and 40B are formed, the conductive patterns 45A and 45B, which are the mounting electrodes, are located inwardly from the surface of the multilayer body 40, and thus the multilayer substrate 4 is able to be accurately positioned relative to the mounting electrodes in the circuit board. If deviation occurs in positioning, the multilayer substrate 4 is moved to a correct location at the time of reflowing, and the location deviation occurring in mounting is significantly reduced or prevented. In addition, the solder portions 201A and 201B remain within the recessed portions 40A and 40B, the amount of protrusion of the solder portions 201A and 201B from the multilayer substrate 4 is significantly reduced. Thus, failures such as shorts with other circuits caused by separation of solder balls into which protrusion of the solder portions 201A and 201B are significantly reduced or prevented.

Similarly, the recessed portions 40C and 40D are formed, the conductive patterns 41A and 41B, which are the mounting electrodes, are located inwardly from the surface of the multilayer body 40, and thus the electronic component 300 is able to be accurately positioned relative to the multilayer substrate 4. If deviation occurs in positioning, the multilayer substrate 4 is moved to a correct location at the time of reflowing, and the location deviation occurring in mounting is significantly reduced or prevented. In addition, the solder portions 201C and 201D remain within the recessed portions 40C and 40D, the amount of protrusion of the solder portions 201C and 201D from the multilayer substrate 4 is significantly reduced. Thus, failures such as shorts with other circuits caused by separation of solder balls into which protrusion of the solder portions 201C and 201D is formed are significantly reduced or prevented.

In the above preferred embodiments, for the sake of simplifying the description, configurations in which the number of stacked base layers is lower than a real number of stacked base layers (e.g., 10) are described. Thus, the difference between the proportion of the low-flow members in the stacking direction in the regions overlapping the mounting electrodes as viewed in the stacking direction and that in the region surrounding the regions overlapping the mounting electrodes appears small in the drawings. However, the real number of the stacked layers is higher than the number illustrated, and the number of the stacked low-flow members located in the region surrounding the regions overlapping the mounting electrodes is higher than the number illustrated. Thus, in actuality, the difference between the proportion in the regions overlapping the mounting electrodes as viewed in the stacking direction and that in the region surrounding the regions overlapping the mounting electrodes is more noticeable.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer substrate manufacturing method comprising:
    a mounting-electrode forming step of forming the mounting electrode on a principal surface of one of a plurality of thermoplastic resin base layers;
    a stacking step of stacking the plurality of thermoplastic resin base layers such that the principal surface of the one of the plurality of thermoplastic resin base layers is an outermost surface; and
    a thermocompression bonding step of laminating the plurality of stacked thermoplastic resin base layers all at once by thermocompression bonding by pressing an elastic member to a portion where the mounting electrode is formed on the outermost surface; wherein
    in the thermocompression bonding step, a recessed portion formed by recessing the thermoplastic resin is formed to be recessed in a portion where the mounting electrode is located;
    in the stacking step, the plurality of thermoplastic resin base layers are stacked such that a proportion of low-flow members in a stacking direction in a region overlapping the mounting electrode as viewed in the stacking direction is lower than that in a region surrounding the region overlapping the mounting electrode, the low-flow members having flowability lower than that in the thermoplastic resin base layers at a temperature in thermocompression bonding of the thermoplastic resin base layers;
    the low-flow members include conductive patterns;
    in the stacking step, the plurality of thermoplastic resin base layers are stacked such that a number of the conductive patterns stacked in the region overlapping the mounting electrode as viewed in the stacking direction is lower than that in the region surrounding the region overlapping the mounting electrode;
    the conductive patterns on the thermoplastic resin base layers define a coil wound around a winding axis extending along the stacking direction; and
    in the stacking step, the plurality of thermoplastic resin base layers are stacked such that the mounting electrode is arranged in a region inside the coil as viewed in the stacking direction.

2. The multilayer substrate manufacturing method according to claim 1, wherein
    in the mounting-electrode forming step, the mounting electrode is formed on each of principal surfaces of different thermoplastic resin base layers;
    in the stacking step, the thermoplastic resin base layers are stacked such that the principal surfaces of the different thermoplastic resin base layers are opposite outermost surfaces; and
    in the thermocompression bonding step, the elastic member is pressed to each of the outermost surfaces, on which the mounting electrodes are formed.

3. The multilayer substrate manufacturing method according to claim 1, wherein the low-flow members include interlayer connective conductors provided in the multilayer substrate.

4. The multilayer substrate manufacturing method according to claim 1, wherein the recessed portion is formed to be recessed inwardly in the stacking direction, and the recessed portion is formed by using conductive patterns or dummy patterns.

5. The multilayer substrate manufacturing method according to claim 1, wherein the recessed portion is formed to be recessed inwardly in the stacking direction, and the recessed portion is formed on only one main surface of the multilayer substrate or on both main surfaces of the multilayer substrate.

6. The multilayer substrate manufacturing method according to claim 1, wherein
    the recessed portion includes a plurality of recessed portions;
    the mounting electrode includes a plurality of mounting electrodes; and
    each of the plurality of mounting electrodes is located at the bottom of a corresponding one of the plurality of recessed portions.

7. A multilayer substrate comprising:
    a multilayer body including a plurality of thermoplastic resin base layers stacked in a stacking direction; and
    a mounting electrode located on a principal surface of the multilayer body; wherein
    the multilayer body includes a recessed portion recessed inwardly in the stacking direction in a portion where the mounting electrode is located, the multilayer body includes low-flow members having flowability lower than that in the thermoplastic resin base layers at a temperature in thermocompression bonding of the thermoplastic resin base layers, and the low-flow members are arranged such that a proportion of the low-flow members in the stacking direction in a region overlapping the mounting electrode as viewed in the stacking direction is lower than that in a region surrounding the region overlapping the mounting electrode;
    the recessed portion includes a plurality of recessed portions;
    the mounting electrode includes a plurality of mounting electrodes;
    each of the plurality of mounting electrodes is located at the bottom of a corresponding one of the plurality of recessed portions;
    the low-flow members include conductive patterns;
    a number of the conductive patterns stacked in the region overlapping the mounting electrode as viewed in the stacking direction is lower than that in the region surrounding the region overlapping the mounting electrode;
    the conductive patterns on the thermoplastic resin base layers define a coil wound around a winding axis extending along the stacking direction; and
    the mounting electrode is arranged in a region inside the coil as viewed in the stacking direction.

8. The multilayer substrate according to claim 7, wherein the multilayer substrate is arranged such that the recessed portion in the multilayer body is fit in a projecting portion where an electrode is disposed in a circuit board, and the mounting electrode is connected to the electrode in the circuit board with solder.

9. The multilayer substrate according to claim 7, wherein the plurality of thermoplastic resin base layers are joined to each other by a thermocompression bond.

10. The multilayer substrate according to claim 7, wherein
the mounting electrode is provided on each of principal surfaces of different thermoplastic resin base layers; and
the thermoplastic resin base layers are stacked such that the principal surfaces of the different thermoplastic resin base layers are opposite outermost surfaces.

11. The multilayer substrate according to claim 7, wherein the low-flow members include interlayer connective conductors provided in the multilayer body.

12. The multilayer substrate according to claim 7, wherein the recessed portion is formed by using conductive patterns or dummy patterns.

13. The multilayer substrate according to claim 7, wherein the recessed portion is formed on only one main surface of the multilayer body or on both main surfaces of the multilayer body.

14. An apparatus comprising:
a circuit board; and
the multilayer substrate according to claim 7 mounted on the circuit board.

15. The apparatus according to claim 14, wherein the circuit board includes a projecting portion that is fit in the recessed portion of the multilayer body.

* * * * *